United States Patent [19]

Shimomura et al.

[11] Patent Number: 5,898,396
[45] Date of Patent: Apr. 27, 1999

[54] ANALOG-TO-DIGITAL CONVERTER FOR BOTH M-BIT AND N-BIT ANALOG CONVERSION

[75] Inventors: Takehiko Shimomura; Nobusuke Abe, both of Tokyo, Japan

[73] Assignee: Mitsubishi Denki Kabushiki Kaisha, Tokyo, Japan

[21] Appl. No.: 08/949,926

[22] Filed: Oct. 14, 1997

[30] Foreign Application Priority Data

May 30, 1997 [JP] Japan ................. 9-142776

[51] Int. Cl.$^6$ .................. H03M 1/00; G06F 3/00
[52] U.S. Cl. .................. 341/163; 395/200.3
[58] Field of Search .................. 341/155, 163, 341/165, 899; 395/200.3, 841, 842, 892

[56] References Cited

U.S. PATENT DOCUMENTS

| | | | |
|---|---|---|---|
| 3,815,098 | 6/1974 | Kimura et al. | 340/725 |
| 4,241,410 | 12/1980 | DePuy | 364/715 |
| 4,621,341 | 11/1986 | New | 364/900 |
| 4,631,740 | 12/1986 | Collins | 377/76 |
| 5,715,419 | 2/1998 | Szczepanek et al. | 395/421.02 |

FOREIGN PATENT DOCUMENTS 7-240687  9/1995  Japan .

Primary Examiner—Howard L. Williams
Assistant Examiner—Peguy JeanPierre
Attorney, Agent, or Firm—Burns, Doane, Swecker & Mathis, LLP

[57] ABSTRACT

There is provided an analog-to-digital converter comprising a first data register (4) for storing an m-bit analog-to-digital conversion result, a second data register (5) for storing an n-bit (n is smaller than m) analog-to-digital conversion result, and an analog-to-digital conversion control circuit (3) for transferring the n (n is smaller than m) highmost bits of the m-bit analog-to-digital conversion result stored in the first data register (4) as an n-bit analog-to-digital conversion result to the second data register (5).

14 Claims, 6 Drawing Sheets

| ADDRESS | D0 — D7<br>LOCATION IDENTIFIED BY<br>(THE ADDRESS + 0) | D8 — D15<br>LOCATION IDENTIFIED BY<br>(THE ADDRESS + 1) |
|---|---|---|
| h' 0100 | | ch0 DATA REGISTER |
| h' 0102 | | ch1 DATA REGISTER |
| h' 0104 | | ch2 DATA REGISTER |
| ⋮ | | |

FIG.5b

| ADDRESS | D0 — D7<br>LOCATION IDENTIFIED BY<br>(THE ADDRESS + 0) | D8 — D15<br>LOCATION IDENTIFIED BY<br>(THE ADDRESS + 1) |
|---|---|---|
| h' 1100 | ch0 DATA REGISTER | ch1 DATA REGISTER |
| h' 1102 | ch2 DATA REGISTER | |
| h' 1104 | | |
| ⋮ | | |

ANALOG-TO-DIGITAL CONVERTER FOR BOTH M-BIT AND N-BIT ANALOG CONVERSION

BACKGROUND OF THE INVENTION

1. Field of the Invention

The present invention relates to an analog-to-digital (A/D) converter which can be incorporated into a one-chip microcomputer, for converting analog signals into digital signals.

2. Description of the Prior Art

Figure 7:
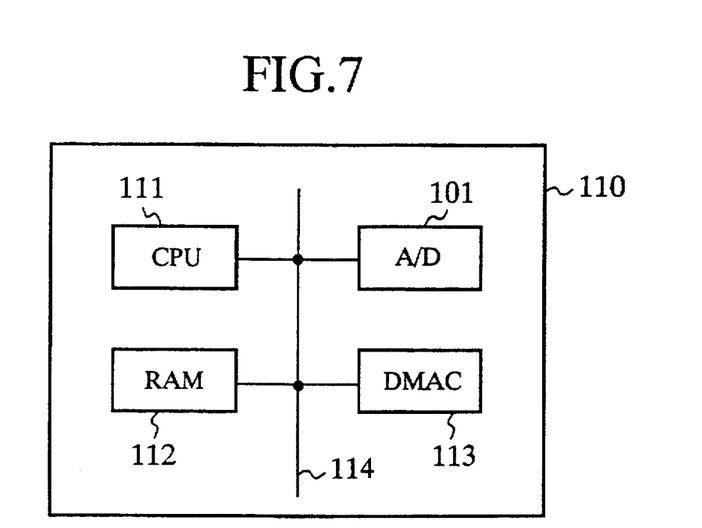
FIG. 7 is a block diagram showing the structure of a one-chip microcomputer.
Figure 8:
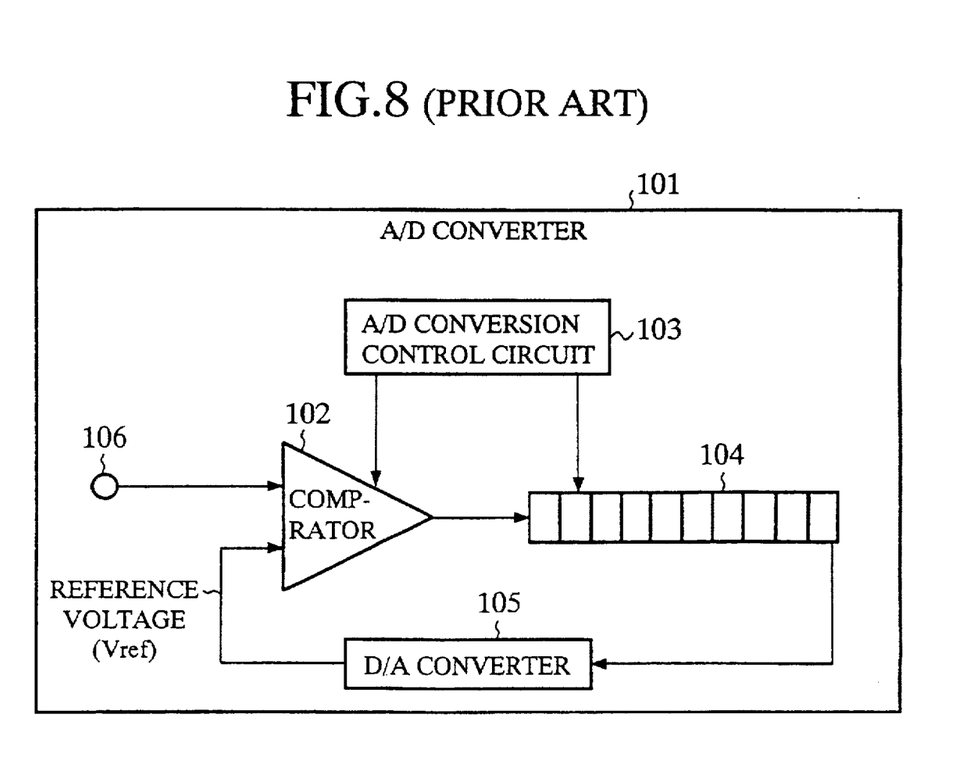
FIG. 8 is a block diagram showing the structure of a prior art A/D converter.

Referring now to FIG. 7, there is illustrated a block diagram showing the structure of a 16-bit one-chip microcomputer 110. In the figure, reference numeral 111 denotes a CPU, 112 denotes a RAM, 113 denotes a direct memory access controller (DMAC), 101 denotes an analog-to-digital (A/D) converter, and 114 denotes an external bus for interconnecting the CPU 111, the RAM 112, the DMAC 113, and the A/D converter 101. Referring next to FIG. 8, there is illustrated a block diagram showing the structure of the A/D converter 101. In the figure, reference numeral 102 denotes a comparator, 103 denotes an A/D conversion control circuit, 104 denotes an m-bit (e.g., 10-bit) data register for storing a conversion result, 105 denotes a digital-to-analog (D/A) converter, and 106 denotes an input terminal to which analog signals to be converted are applied.

A few kinds of analog-to-digital conversion methods each using a specific algorithm have been used. Hereinafter, a description will be made as to the successive approximation conversion method which is widely used for microcomputers or the like, as an example. In operation, an analog signal to be converted which is applied to the input terminal 106 is input to one input terminal of the comparator 102 and simultaneously a reference voltage Vref from the D/A converter 105 is input to the other input terminal of the comparator 102.

The comparator 102 then compares the input signal with the reference voltage Vref and then furnishes an output signal indicating the comparison result to the data register 104, under control of the A/D conversion control circuit 103. The value of the output signal is stored into the data register 104 as one bit of a digital signal which is the A/D conversion result of the input signal. At the completion of the bit conversion operation, the value stored in the data register 104 is delivered to the D/A converter 105 and is then digital-to-analog converted, so that the reference voltage Vref having a value different from the previous value is generated and is then furnished to the other input terminal of the comparator 102. The comparator 102 then compares the input signal applied to the input terminal with the reference voltage Vref having the new value and furnishes the output signal indicating the comparison result to the data register 104. The value of the output signal is then stored in the data register 104 as another bit of the digital signal. Such the bit conversion operation is repeated so that all bits (e.g., ten bits) are obtained as the A/D conversion result.

The prior art A/D converter which is so constructed as mentioned above thus provides all the bits, e.g., all of the ten bits as the A/D conversion result. Therefore, when using the prior art A/D converter with 10-bit resolution as shown in FIG. 8 to carry out a control operation which does not need an accuracy of 10bits, the steps of transferring the conversion result from the data register 104 to the RAM 112 shown in FIG. 7 and shifting the conversion result to generate an n-bit, e.g., 8-bit, data. On the other hand, 16-bit one-chip microcomputers handle data in a byte or 16 bits batch.

Therefore, A/D converters with 10-bit resolution, which can be incorporated into a 16-bit one-chip microcomputer, have to transfer a 10-bit conversion result in a first byte batch including the two highmost or lowermost bits of the conversion result and in a second byte batch including the remaining 8 bits of the conversion result separately. Thus 10-bit A/D converters have to handle byte data including needless 6-bit data.

To this end, one-chip microcomputers including such a prior art 10-bit A/D converter need to transfer and shift data by means of the CPU 111, DMAC 113, or the like. Such a sequence of transferring and shifting operations can occupy the external bus 114. This results in reducing the real time processing capability of one-chip microcomputers including a prior art A/D converter. Furthermore, a memory area of 16 bits is needed in order to store one 10-bit conversion result in the RAM 112. This results in reducing available memory space in the RAM 112.

Although prior art 10-bit A/D converters can include a built-in additional circuit for selecting either an 8-bit A/D conversion result or a 10-bit A/D conversion result according to a value written into a mode register, such prior art A/D converters have drawbacks that the mode register must be set before starting an A/D conversion operation and both 10-bit and 8-bit conversion results cannot be obtained simultaneously.

SUMMARY OF THE INVENTION

The present invention is made to overcome the problems. It is therefore an object of the present invention to provide an m-bit A/D converter which can convert analog input signals into both m-bit digital signals and n-bit (n is smaller than m) digital signals.

In accordance with one aspect of the present invention, there is provided an analog-to-digital converter comprising a first data register for storing an m-bit analog-to-digital conversion result, a second data register for storing an n-bit (n is smaller than m) analog-to-digital conversion result, and an A/D conversion control circuit for transferring the n (n is smaller than m) highmost or lowermost bits of the m-bit analog-to-digital conversion result stored in the first data register as an n-bit analog-to-digital conversion result to the second data register.

Preferably, the n-bit analog-to-digital conversion result can be mapped into the second data register in such a manner that the n-bit analog-to-digital conversion result is stored in half-word units. Alternatively, the n-bit analog-to-digital conversion result can be mapped into the second data register in such a manner that the n-bit analog-to-digital conversion result is stored in byte units.

In accordance with another aspect of the present invention, there is provided an analog-to-digital converter comprising a data register for storing an m-bit analog-to-digital conversion result, and a shifter being responsive to a first control signal applied thereto, for reading the m-bit analog-to-digital conversion result from the data register and then sending out the m-bit analog-to-digital conversion result, just as it is, and being responsive to a second control signal applied thereto, for reading the m-bit analog-to-digital conversion result from the data register and extracting the n (n is smaller than m) highmost or lowermost bits of the m-bit analog-to-digital conversion result, and then sending out the n-bit highmost or lowermost bits as an n-bit analog-to-digital conversion result. Preferably, the A/D converter further comprises an analog-to-digital conversion control circuit for furnishing the first control signal to the shifter in response to a first address identifying a location where the m-bit analog-to-digital conversion result is stored, and for furnishing the second control signal to the shifter in response to a second address identifying a location where the corresponding n-bit analog-to-digital conversion result is assumed to be stored.

An n-bit analog-to-digital conversion result can be mapped into the data register as if the n-bit analog-to-digital conversion result is stored in half-word units. Alternatively, an n-bit analog-to-digital conversion result can be mapped into the data register as if the n-bit analog-to-digital conversion result is stored in byte units.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
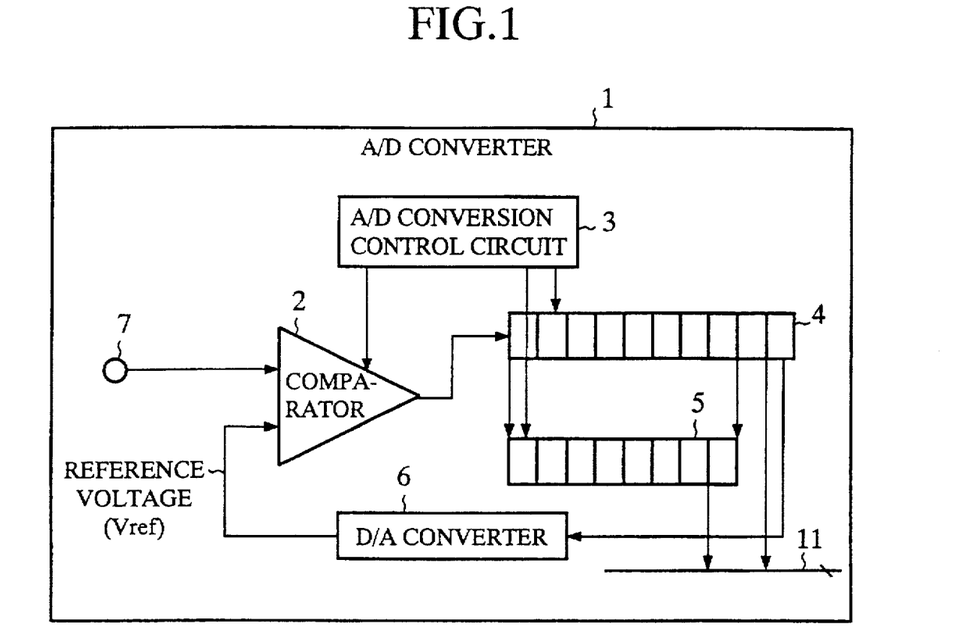
FIG. 1 is a block diagram showing the structure of an A/D converter according to a first embodiment of the present invention.

Referring next to FIG. 1, there is illustrated a block diagram showing the structure of an A/D converter according to a first embodiment of the present invention. In the figure, reference numeral 1 denotes the A/D converter provided with a comparator 2, an A/D conversion control circuit 3, a first data register 4 for storing an m-bit (e.g., 10-bit) conversion result, a second data register 5 for storing an n-bit (n is smaller than m), e.g., 8-bit, conversion result, a digital-to-analog (D/A) converter 6, and an input terminal 7 to which analog signals to be converted are applied.

In operation, an analog signal to be converted which is applied to the input terminal 7 is input to one input terminal of the comparator 2 and simultaneously a reference voltage Vref from the D/A converter 6 is input to the other input terminal of the comparator 2. The comparator 2 then compares the input signal with the reference voltage Vref and then furnishes an output signal indicating the comparison result to the data register 4, under control of the A/D conversion control circuit 3. The value of the output signal is stored into the data register 4 as one bit of a digital signal which is the m-bit A/D conversion result of the input signal. At the completion of the bit conversion operation, the value stored in the data register 4 is delivered to the D/A converter 6 and is then digital-to-analog converted, so that the reference voltage Vref having a value different from the previous value is generated and is then furnished to the other input terminal of the comparator 2. The comparator 2 then compares the input signal applied to the input terminal with the reference voltage Vref having the new value and stores the value of its output signal indicating the comparison result into the data register 4 as the next bit of the digital signal. Such the bit conversion operation is repeated so that all the m bits (e.g., ten bits) are obtained as the m-bit A/D conversion result. The n (e.g., eight) highmost bits of the m-bit A/D conversion result stored in the first data register 4 are transferred to the second data register 5 and are then stored in the second data register 5, under control of the A/D conversion control circuit 3.

As previously mentioned, the A/D converter according to the first embodiment of the present invention can store m-bit A/D conversion results in the first data register 4 and store the n highmost bits of the m-bit A/D conversion results in the second data register 5. The A/D converter thus provides both m-bit and n-bit A/D conversion results simultaneously. The A/D converter of this embodiment can selectively send out either m-bit A/D conversion results or n-bit A/D conversion results on the external bus 11 under the control of the A/D conversion control circuit 3.

Second Embodiment

Figure 2:
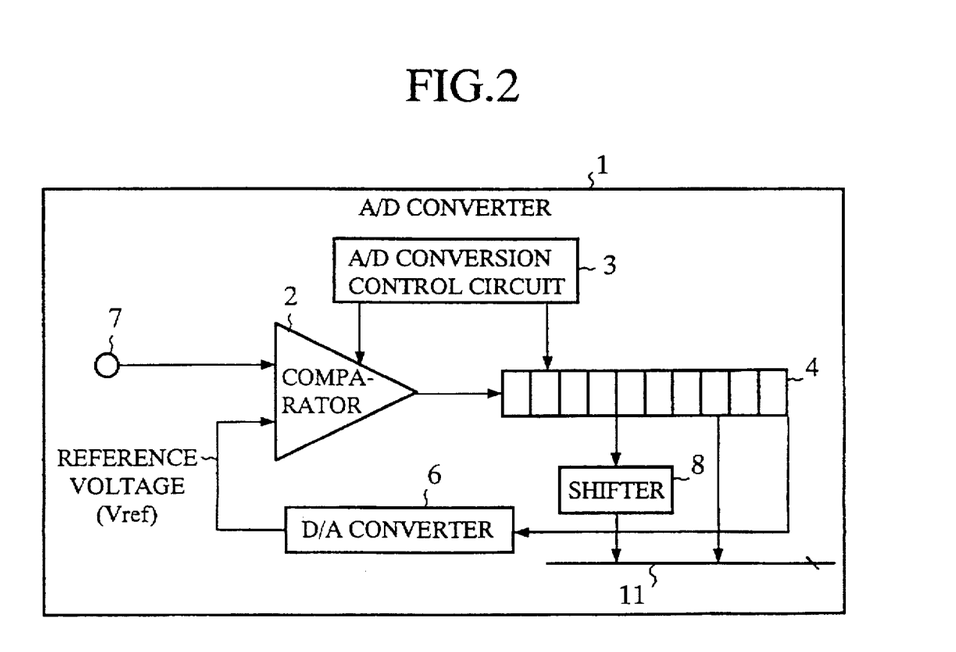
FIG. 2 is a block diagram showing the structure of an A/D converter according to a second embodiment of the present invention.

Referring next to FIG. 2, there is illustrated a block diagram showing the structure of a 10-bit A/D converter according to a second embodiment of the present invention. In the figure, reference numeral 8 denotes a shifter for shifting an m-bit (e.g., 10-bit) A/D conversion result stored in the m-bit data register 4 so as to extract and read only the n (e.g., eight) highmost bits of the m-bit A/D conversion result. The same components as the A/D converter of the first embodiment are designated by the same reference numerals as FIG. 1, and therefore the duplicated description about the components will be omitted hereinafter.

Figure 3:
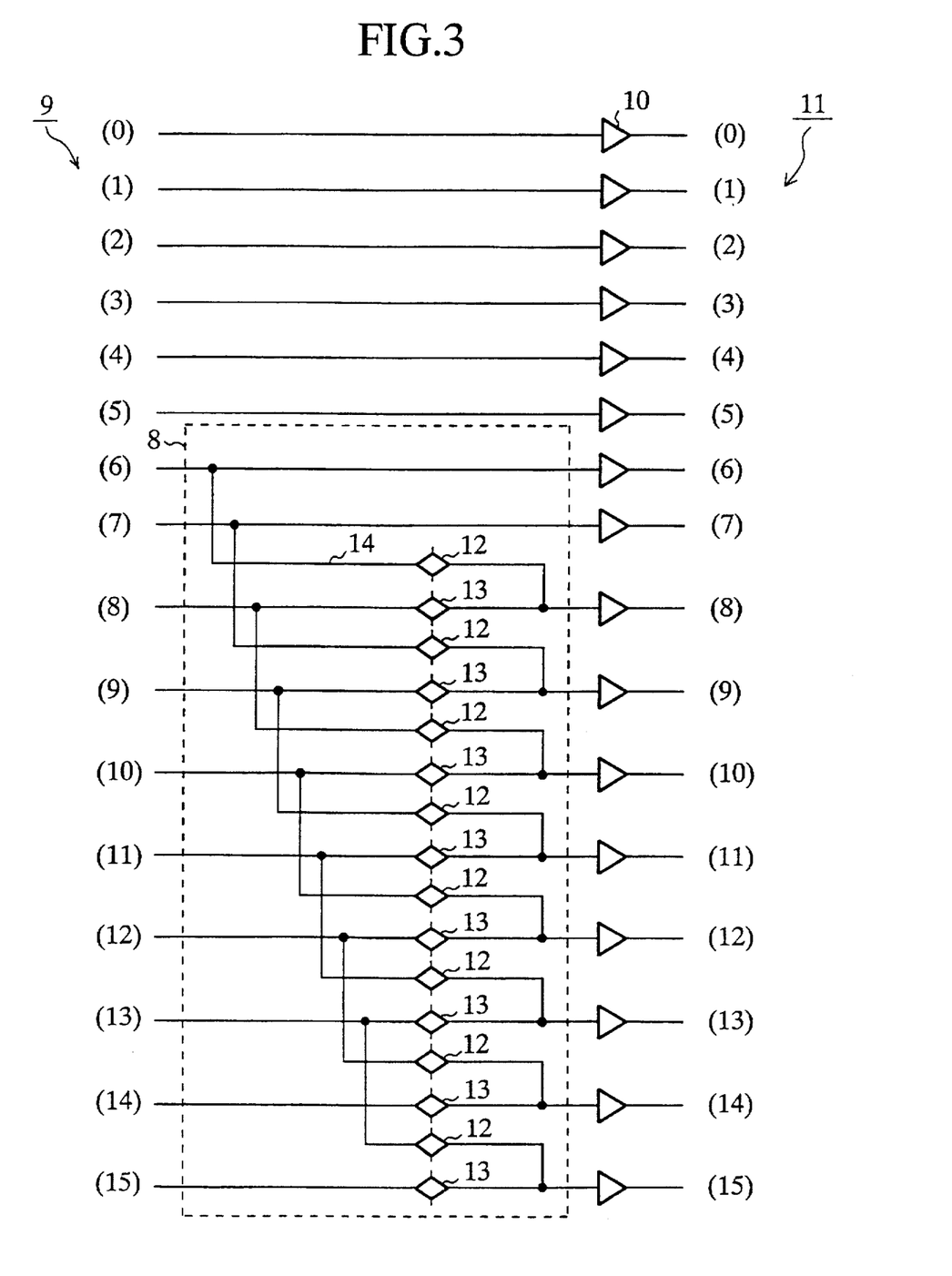
FIG. 3 is a circuit diagram showing the structure of a shifter of the A/D converter according to the second embodiment of the present invention shown in FIG. 2.

Referring next to FIG. 3, there is illustrated a circuit diagram showing the structure of the shifter 8 which is incorporated into the A/D converter of this embodiment. In the figure, reference numeral 9 denotes a 16-bit local bus connected to the data register 4 for storing a 10-bit conversion result, 10 denotes an output buffer connected to each of a plurality of lines of the local bus 9. The outputs of the plurality of output buffers 10 are connected to the external bus 11. The seventh through sixteenth (bit 6 through bit 15) lines of the local bus 9 are connected to the ten input terminals of the shifter 8, respectively. Furthermore, a plurality of transmission gates 12 are provided on respective connection paths 14 for connecting the seventh through fourteenth (bit 6 through bit 13) lines of the local bus 9 to the input terminals of the ninth through sixteenth (bit 8 through bit 15) output buffers 10, respectively, and a plurality of transmission gates 13 are provided on the ninth through sixteenth (bit 8 through bit 15) lines of the local bus 9, respectively. The plurality of transmission gates 13 can be replaced by a plurality of other logic gates such as clocked gates.

Since the A/D conversion operation of the A/D converter of the second embodiment is the same as that of the A/D converter of the above-mentioned first embodiment shown in FIG. 1, the duplicated description about the A/D conversion operation will be omitted hereinafter. As can be seen from FIG. 2, the A/D converter of the second embodiment differs from that of the first embodiment in that it does not comprise the second data register 5 for storing 8-bit A/D conversion results, but it comprises the first data register 4 for storing 10-bit A/D conversion results. In order for the A/D converter to send a 10-bit A/D conversion result obtained, just as it is, the A/D converter enables the A/D conversion control circuit 3 to furnish a first set of control signals for turning on the plurality of transmission gates 13 on the local bus 9 and turning off the plurality of transmission gates 12 on the connection paths 14. The 10-bit A/D conversion result stored in the data register 4 connected to the seventh through sixteenth (bit 6 through bit 15) lines of the local bus 9 are thus sent out on the external bus 11, just as it is.

On the contrary, in order for the A/D converter to send a corresponding 8-bit conversion result, the A/D converter enables the A/D conversion control circuit 3 to furnish a second set of control signals for turning off the plurality of transmission gates 13 on the local bus 9 and turning on the plurality of transmission gates 12 on the connection paths 14. The seventh through fourteenth (bit 6 through bit 13) bits of a corresponding 10-bit A/D conversion result stored in the data register 4 connected to the seventh through sixteenth (bit 6 through bit 15) lines of the local bus 9 are thus shifted by 2 bits, and the eight bits are then sent out on the external bus 11.

As previously mentioned, the A/D converter according to the second embodiment of the present invention can offer the sharing of the single data register 4 for 10-bit conversion result storage and 8-bit conversion result storage. The A/D converter can provide both 10-bit and 8-bit conversion results without an additional data register for storing 8-bit conversion results. Accordingly, the second embodiment makes it possible to make use of existing A/D converters. Furthermore, the second embodiment makes it possible to reduce the dimensions of an A/D converter in which components are laid out and hence provide an A/D converter compact in size.

Third Embodiment

Figure 4A:
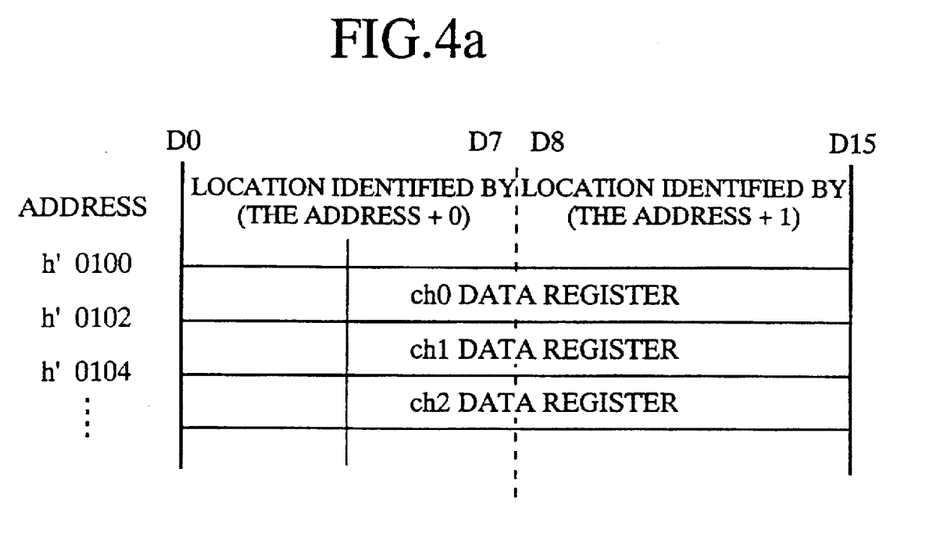
FIG. 4a is a view showing a memory map of a data register of an A/D converter according to a third embodiment of the present invention when it stores a 10-bit conversion result.
Figure 4B:
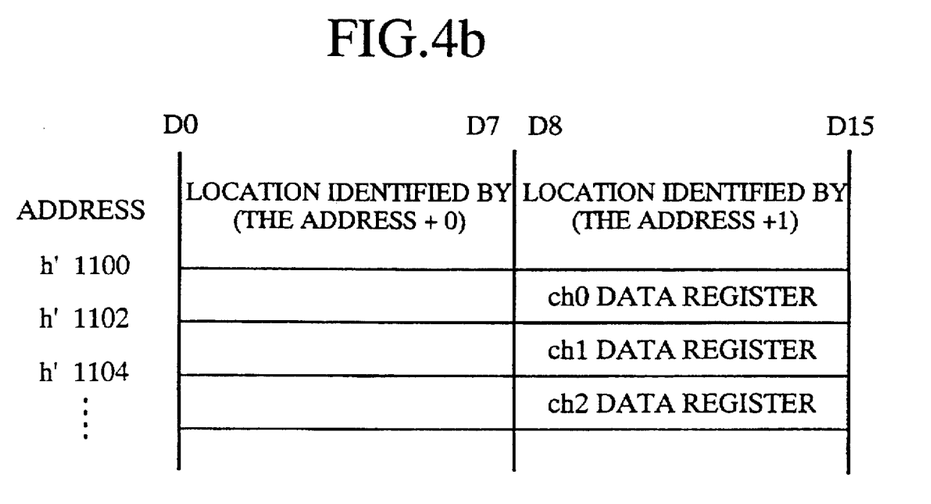
FIG. 4b is a view showing a memory map of the data register of the A/D converter according to the third embodiment of the present invention when it stores an 8-bit conversion result.

Referring next to FIGS. 4a and 4b, there are illustrated a view showing a memory map of the data register 4 of an A/D converter according to a third embodiment of the present invention when it stores a 10-bit A/D conversion result, and a view showing a memory map of the data register 4 of the A/D converter when it can be assumed to store a corresponding 8-bit A/D conversion result in one-half of half-word units (sixteen bits). The 8-bit analog-to-digital conversion result is mapped into the data register 4 as if the 8-bit analog-to-digital conversion result is stored in half-word units. The A/D conversion control circuit 3 of the third embodiment is adapted to control the shifter 8 shown in FIG. 3 by using part of the address information associated with the memory maps shown in FIGS. 4a and 4b.

It can be seen from a comparison between each first address identifying a location where a 10-bit A/D conversion result is assumed to be stored in the data register 4 and each second address identifying a location where a corresponding 8-bit A/D conversion result is assumed to be stored in the data register 4, as shown in FIGS. 4a and 4b, that the only difference between the value of each first address of four hexadecimal digits (e.g., "h'0100") and that of each second address of four hexadecimal digits (e.g., "h'1100") is the values of the fourth digits of the first and second addresses. Thus the A/D conversion control circuit 3 can selectively send out either a 10-bit A/D conversion result or a corresponding 8-bit A/D conversion result on the external bus 11 according to whether the value of the fourth digit of an address applied to the A/D converter is 1 or 0. For example, when the value of the fourth digit of the address applied to the A/D converter is 0, that is, when the A/D converter receives a first address identifying a location where a 10-bit A/D conversion result is assumed to be stored, the A/D conversion control circuit 3 furnishes a first set of control signals for turning on the plurality of transmission gates 13 of the shifter 8 and for turning off the plurality of transmission gates 12 of the shifter 8 so as to enable the A/D converter to send out the 10-bit A/D conversion result stored in the data register 4 on the external bus 11, just as it is. On the contrary, when the value of the fourth digit of the address applied to the A/D converter is 1, that is, when the A/D converter receives a second address identifying a location where a corresponding 8-bit A/D conversion result is assumed to be stored, the A/D conversion control circuit 3 furnishes a second set of control signals for turning off the plurality of transmission gates 13 of the shifter 8 and for turning on the plurality of transmission gates 12 of the shifter 8 so as to allow the shifter 8 to shift the 10-bit A/D conversion result stored in the data register two bit positions and then enable the A/D converter to send out the eight highmost bits of the 10-bit A/D conversion result stored in the data register 4 on the external bus 11.

As previously mentioned, the A/D converter according to the third embodiment of the present invention can selectively provide either one of 10-bit and 8-bit conversion results by using the difference between the first address identifying a location where a 10-bit A/D conversion result is assumed to be stored in the data register 4 and the second address identifying a location where a corresponding 8-bit A/D conversion result is assumed to be stored in the data register 4. Accordingly, the third embodiment makes it possible to reduce the dimensions of an A/D converter in which components are laid out. Furthermore, the third embodiment can provide a simple and flexible A/D converter.

Fourth Embodiment

Figure 5A:
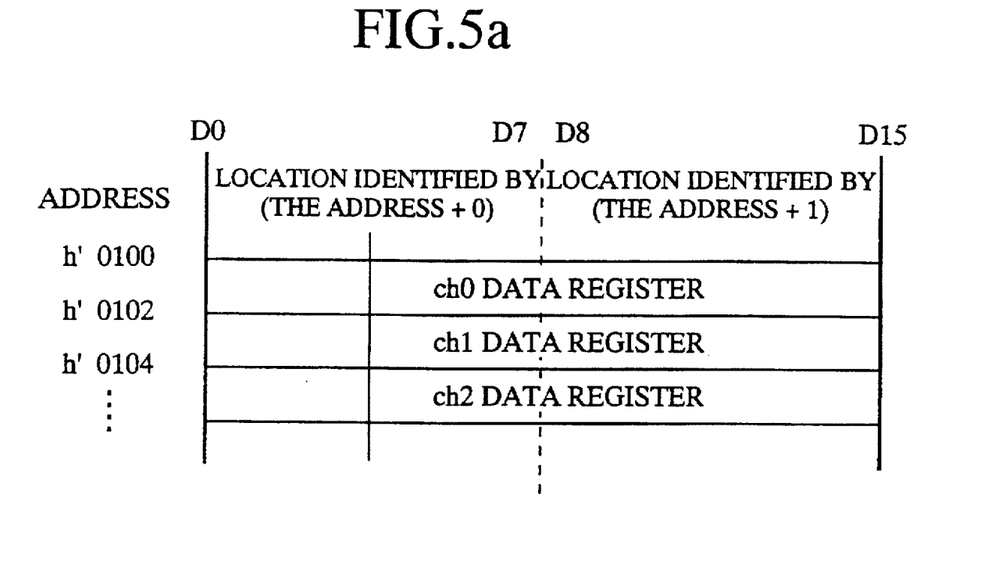
FIG. 5a is a view showing a memory map of a data register of an A/D converter according to a fourth embodiment of the present invention when it stores a 10-bit conversion result.
Figure 5B:
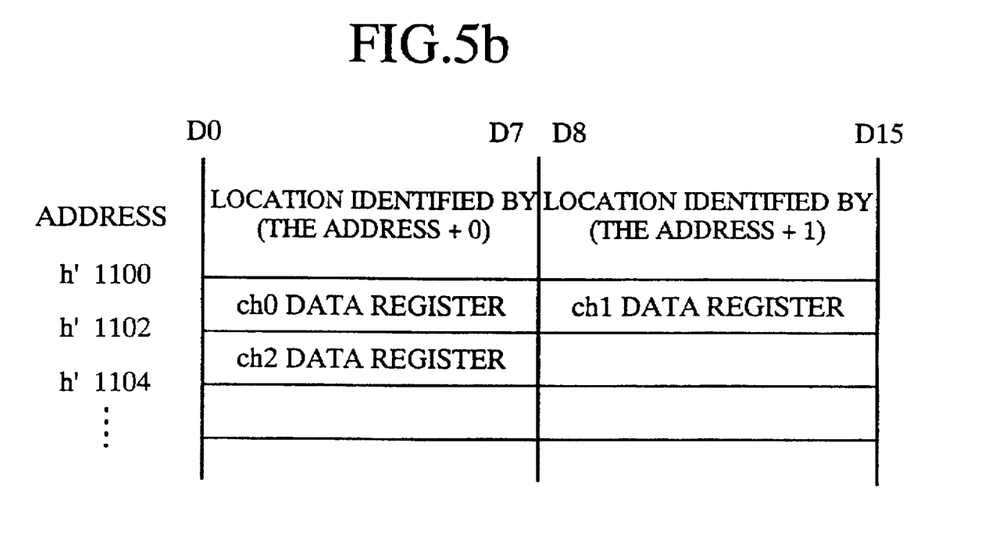
FIG. 5b is a view showing a memory map of the data register of the A/D converter according to the fourth embodiment of the present invention when it stores an 8-bit conversion result.
Figure 6:
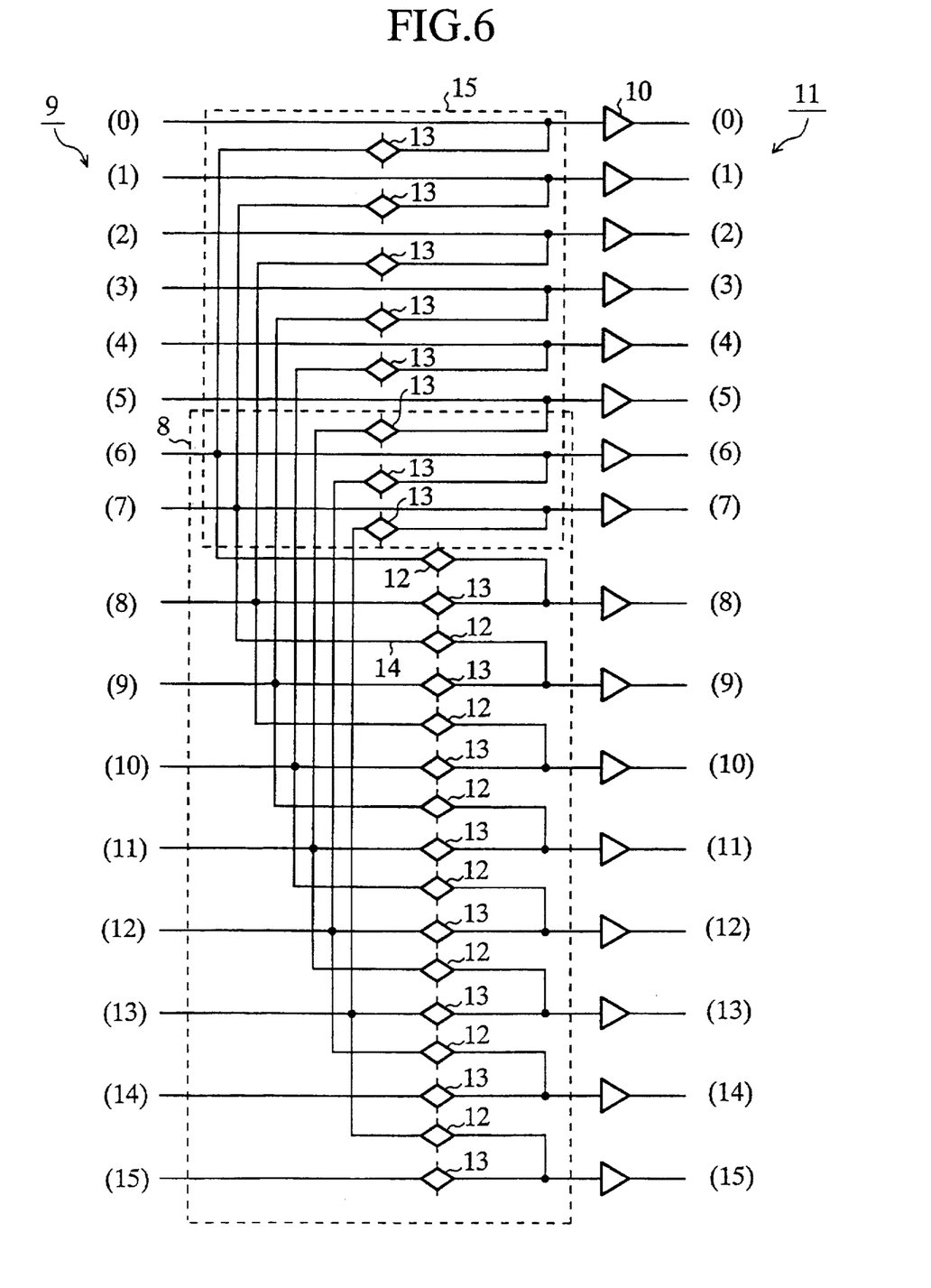
FIG. 6 is a circuit diagram showing the structure of shifters of the fourth embodiment for storing 8-bit conversion results in byte units.

Referring next to FIGS. 5a and 5b, there are illustrated a view showing a memory map of the data register of an A/D converter according to a fourth embodiment of the present invention when it stores a 10-bit A/D conversion result, and a view showing a memory map of the data register of the A/D converter when it can be assumed to store a corresponding 8-bit A/D conversion result in byte units (eight bits). The 8-bit analog-to-digital conversion result is mapped into the data register 4 as if the 8-bit analog-to-digital conversion result is stored in byte units. Furthermore, FIG. 6 shows the structure of shifters 8 and 15 which are adapted to send out 8-bit A/D conversion results in byte units (eight bits) and which are activated alternately. The shifter 8 has the same structure as that of the second embodiment shown in FIG. 3. The shifter 15 includes a plurality of transmission gates 13 disposed on respective connection paths for connecting the seventh through fourteenth (bit 6 through bit 13) lines of the local bus 9 to the input terminals of the first through eighth (bit 0 through bit 7) output buffers 10, respectively. The other structure of the A/D converter of the fourth embodiment is the same as that of the A/D converter of the first embodiment shown in FIG. 1, and therefore the duplicated description about the other structure of the A/D converter will be omitted hereinafter.

Like the above-mentioned third embodiment, when sending out a 10-bit A/D conversion result obtained, the A/D converter enables the A/D conversion control circuit 3 to furnish a first set of control signals for turning on the plurality of transmission gates 13 of the shifter 8 and turning off the plurality of transmission gates 12 of the shifter 8, in response to a first address applied thereto the fourth digit of which is 0. The 10-bit A/D conversion result stored in the data register 4 connected to the seventh through sixteenth (bit 6 through bit 15) lines of the local bus 9 is thus sent out on the external bus 11, just as it is. On the contrary, when sending out a corresponding 8-bit A/D conversion result, the A/D converter enables the A/D conversion control circuit 3 to furnish a second set of control signals for alternately turning on the plurality of transmission gates 12 of the shifter 8 and the plurality of transmission gates 13 of the shifter 15 while turning off the plurality of transmission gates 13 of the shifter 8, in response to a second address applied thereto the fourth digit of which is 1. The A/D converter thus sends out 8-bit A/D conversion results on bit 0 through bit 7 of the external bus 11 and bit 8 through bit 15 of the external bus 11 in byte units, alternately. In other words, the data register 4 disposed in the A/D converter thus serves as if it successively stores 8-bit A/D conversion results in locations identified by each address of four hexadecimal digits, i.e., each address specified as (each hexadecimal number shown in the figure +0) or (each hexadecimal number shown in the figure +1) in byte units without making empty space, as shown in FIG. 5b.

As previously mentioned, the A/D converter according to the fourth embodiment of the present invention can send out 8-bit A/D conversion results on bit 0 through bit 7 of the external bus 11 and bit 8 through bit 15 of the external bus 11 in byte units, alternately. Accordingly, when an AD converter of this embodiment is incorporated into a system which can transfer A/D conversion results in cooperation with DMAC, the A/D converter can transfer A/D conversion results with efficiency.

Numerous variants may be made in the exemplary embodiments mentioned above. It is clear from the above description that the mapping according to the third embodiment can be applied to the A/D converter of the first embodiment. In this case, an 8-bit analog-to-digital conversion result can be mapped into the second data register 5 in such a manner that the 8-bit analog-to-digital conversion result is stored in half-word units. It is also apparent that the mapping according to the fourth embodiment can be applied to the A/D converter of the first embodiment. In this case, an 8-bit analog-to-digital conversion result can be mapped into the second data register 5 in such a manner that the 8-bit analog-to-digital conversion result is stored in byte units. In either case, the A/D conversion control circuit can selectively send out either a 10-bit A/D conversion result or an 8-bit A/D conversion result on the external bus according to whether the value of the fourth digit of an address applied to the A/D converter is 1 or 0. It would also be possible to extract and read the eight lowermost bits of a 10-bit A/D conversion result stored in the data register, instead of the eight highmost bits of the 10-bit A/D conversion result.

As previously mentioned, the present invention offers the following advantages.

In accordance with a preferred embodiment of the present invention, there is provided an analog-to-digital converter comprising a first data register for storing an m-bit analog-to-digital conversion result, a second data register for storing an n-bit (n is smaller than m) analog-to-digital conversion result, and an A/D conversion control circuit for transferring the n (n is smaller than m) highmost or lowermost bits of the m-bit analog-to-digital conversion result stored in the first data register as an n-bit analog-to-digital conversion result to the second data register. Accordingly, the A/D converter of this embodiment can convert analog input signals into both m-bit A/D conversion results and n-bit A/D conversion results, and hence provide either one of them optionally. As a result, when using the m-bit A/D converter to carry out a control operation which does not need an accuracy of m bits, data processing by CPU (data transfer to RAM and shifting data) is not needed while only deliver of n-bit A/D conversion results is needed. This results in improving the real time processing capability of a one-chip microcomputer including the A/D converter of this embodiment because the external bus cannot be occupied by data processing by CPU. Furthermore, available RAM space in the one-chip microcomputer is increased.

In accordance with another preferred embodiment of the present invention, there is provided an analog-to-digital converter comprising a data register for storing an m-bit analog-to-digital conversion result, and a shifter being responsive to a first control signal applied thereto, for reading the m-bit analog-to-digital conversion result from the data register and then sending out the m-bit analog-to-digital conversion result, just as it is, and being responsive to a second control signal applied thereto, for reading the m-bit analog-to-digital conversion result from the data register and extracting the n (n is smaller than m) highmost or lowermost bits of the m-bit analog-to-digital conversion result, and then sending out the n-bit highmost or lowermost bits as an n-bit analog-to-digital conversion result. Accordingly, the A/D converter of this embodiment can offer the sharing of the single data register for m-bit conversion result storage and n-bit conversion result storage. The A/D converter can provide both m-bit and n-bit conversion results without an additional data register for storing n-bit conversion results. Therefore this embodiment makes it possible to make use of existing A/D converters. Furthermore, the embodiment makes it possible to reduce the dimensions of an A/D converter in which components are laid out and hence provide an A/D converter compact in size.

In accordance with another preferred embodiment of the present invention, an n-bit analog-to-digital conversion result can be mapped into the data register as if the n-bit analog-to-digital conversion result is stored in half-word units. Accordingly, this embodiment makes it possible to reduce the dimensions of an A/D converter in which components are laid out. Furthermore, this embodiment can provide a simple and flexible A/D converter.

In accordance with another preferred embodiment of the present invention, an n-bit analog-to-digital conversion result can be mapped into the data register as if the n-bit analog-to-digital conversion result is stored in byte units. Accordingly, when an AD converter of this embodiment is incorporated into a system which can transfer A/D conversion results in cooperation with DMAC, the A/D converter can transfer A/D conversion results with efficiency.

Many widely different embodiments of the present invention may be constructed without departing from the spirit and scope of the present invention. It should be understood that the present invention is not limited to the specific embodiments described in the specification, except as defined in the appended claims.

What is claimed is:

1. An analog-to-digital converter comprising:

a first data register for storing an m-bit analog-to-digital conversion result;

a second data register for storing an n-bit (n is smaller than m) analog-to-digital conversion result; and a control means for transferring the n highmost or lowermost bits of the m-bit analog-to-digital conversion result stored in the said first data register as an n-bit analog-to-digital conversion result to said second data register.

2. The analog-to-digital converter according to claim 1, wherein the n-bit analog-to-digital conversion result is mapped into said second data register in such a manner that the n-bit analog-to-digital conversion result is stored in half-word units.

3. The analog-to-digital converter according to claim 1, wherein the n-bit analog-to-digital conversion result is mapped into said second data register in such a manner that the n-bit analog-to-digital conversion result is stored in byte units.

4. The microcomputer according to claim 1, wherein the n-bit analog-to-digital conversion result is mapped into said second data register in such a manner that the n-bit analog-to-digital conversion result is stored in half-word units.

5. An analog-to-digital converter comprising:

a data register for storing an m-bit analog-to-digital conversion result; and a shifter means being responsive to a first control signal applied thereto, for reading the m-bit analog-to-digital conversion result from said data register and then sending out the m-bit analog-to-digital conversion result, just as it is, and being responsive to a second control signal applied thereto, for reading the m-bit analog-to-digital conversion result from said data register and extracting the n (n is smaller than m) highmost or lowermost bits of the m-bit analog-to-digital conversion result, and then sending out the n-bit highmost or lowermost bits as an n-bit analog-to-digital conversion result.

6. The analog-to-digital converter according to claim 5, further comprising a control means for furnishing the first control signal to said shifter means in response to a first address identifying a location where the m-bit analog-to-digital conversion result is stored, and for furnishing the second control signal to said shifter means in response to a second address identifying a location where the n-bit analog-to-digital conversion result is stored.

7. The analog-to-digital converter according to claim 5, wherein an n-bit analog-to-digital conversion result is mapped into said data register as if the n-bit analog-to-digital conversion result is stored in half-word units.

8. The analog-to-digital converter according to claim 5, wherein an n-bit analog-to-digital conversion result is mapped into said data register as if the n-bit analog-to-digital conversion result is stored in byte units.

9. A one-chip microcomputer comprising:

a central processing unit;

a memory;

a direct access memory controller;

an analog-to-digital converter, said analog-to-digital including:

a first data register for storing an m-bit analog-to-digital conversion result;

a second data register for storing an n-bit (n is smaller than m) analog-to-digital conversion result; and a control means for transferring the n highmost or lowermost bits of the m-bit analog-to-digital conversion result stored in the said first data register as an n-bit analog-to-digital conversion result to said second data register; and a bus for interconnection said central processing unit, said memory, said direct memory access controller and said analog-to-digital converter.

10. The microcomputer according to claim 9, wherein the n-bit analog-to-digital conversion result is mapped into said second data register in such a manner that the n-bit analog-to-digital conversion result is stored in byte units.

11. A one-chip microcomputer comprising:

a central processing unit;

a memory;

a direct access memory controller;

an analog-to-digital converter, said analog-to-digital including:

a data register for storing an m-bit analog-to-digital conversion result; and a shifter means being responsive to a first control signal applied thereto, for reading the m-bit analog-to-digital conversion result from said data register and then sending out the m-bit analog-to-digital conversion result, just as it is, and being responsive to a second control signal applied thereto, for reading the m-bit analog-to-digital conversion result from said data register and extracting the n (n is smaller than m) highmost or lowermost bits of the m-bit analog-to-digital conversion result, and then sending out the n-bit highmost or lowermost bits as an n-bit analog-to-digital conversion result; and a bus for interconnection said central processing unit, said memory, said direct memory access controller and said analog-to-digital converter.

12. The microcomputer according to claim 11, further comprising a control means for furnishing the first control signal to said shifter means in response to a first address identifying a location where the m-bit analog-to-digital conversion result is stored, and for furnishing the second control signal to said shifter means in response to a second address identifying a location where the n-bit analog-to-digital conversion result is stored.

13. The microcomputer according to claim 11, wherein an n-bit analog-to-digital conversion result is mapped into said data register as if the n-bit analog-to-digital conversion result is stored in halfword units.

14. The microcomputer according to claim 11, wherein an n-bit analog-to-digital conversion result is mapped into said data register as if the n-bit analog-to-digital conversion result is stored in byte units.

* * * * *